United States Patent
Yun et al.

(10) Patent No.: US 7,584,761 B1
(45) Date of Patent: *Sep. 8, 2009

(54) WAFER EDGE SURFACE TREATMENT WITH LIQUID MENISCUS

(75) Inventors: Seokmin Yun, Pleasanton, CA (US); John M. Boyd, Hillsboro, OR (US); John M. de Larios, Palo Alto, CA (US); Fritz Redeker, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 411 days.

This patent is subject to a terminal disclaimer.

(21) Appl. No.: 11/292,465

(22) Filed: Dec. 2, 2005

Related U.S. Application Data

(63) Continuation-in-part of application No. 09/608,244, filed on Jun. 30, 2000, now Pat. No. 6,488,040, and a continuation-in-part of application No. 10/261,839, filed on Sep. 30, 2002, now Pat. No. 7,234,477, and a continuation-in-part of application No. 10/603,427, filed on Jun. 24, 2003, now Pat. No. 7,000,622.

(51) Int. Cl.
*B08B 3/00* (2006.01)
(52) U.S. Cl. ............................ 134/99.1; 134/94.1
(58) Field of Classification Search ............... 134/1, 134/133, 94.1, 99.1, 166 R, 167 R, 198, 902
See application file for complete search history.

(56) References Cited

U.S. PATENT DOCUMENTS

| | | | |
|---|---|---|---|
| 3,953,265 A * | 4/1976 | Hood | 438/8 |
| 4,838,289 A | 6/1989 | Kottman et al. | 134/153 |
| 5,271,774 A | 12/1993 | Leenaars et al. | 134/31 |
| 5,601,655 A * | 2/1997 | Bok et al. | 134/1 |
| 5,660,642 A | 8/1997 | Britten | 134/30 |
| 5,705,223 A | 1/1998 | Bunkofske | 427/240 |
| 5,807,522 A | 9/1998 | Brown et al. | 422/50 |
| 5,830,334 A * | 11/1998 | Kobayashi | 204/224 R |

(Continued)

FOREIGN PATENT DOCUMENTS

EP 0905746 3/1999

(Continued)

OTHER PUBLICATIONS

J. A. Britten; "A Moving-Zone Marangoni Drying Process For Critical Cleaning And Wet Processing"; Oct. 1997; Solid State Technology; http://solidstate.articles.printthis.clickability.coms.

*Primary Examiner*—Michael Barr
*Assistant Examiner*—Rita R Patel
(74) *Attorney, Agent, or Firm*—Martine Penilla & Gencarella, LLP

(57) ABSTRACT

A method for cleaning an edge surface of a semiconductor substrate is disclosed. The proximity head unit is positioned so that the flow head portion and the collection head portion of the proximity head unit are proximate to the edge surface of the semiconductor substrate. The semiconductor substrate is then rotated using one or more powered rollers. During the rotation of the semiconductor substrate, the flow head portion applies a fluid to the edge surface while the collection head portion collects fluid from the edge surface. Additional methods, an apparatuses, and a system for cleaning an edge surface of a semiconductor substrate are also described.

8 Claims, 11 Drawing Sheets

U.S. PATENT DOCUMENTS

| | | | | |
|---|---|---|---|---|
| 5,882,433 | A | 3/1999 | Ueno | 134/31 |
| 5,945,351 | A | 8/1999 | Mathuni | 438/706 |
| 5,975,098 | A | 11/1999 | Yoshitani et al. | 134/148 |
| 5,989,478 | A | 11/1999 | Ouellette et al. | 264/468 |
| 5,997,653 | A | 12/1999 | Yamasaka | 134/2 |
| 6,092,937 | A * | 7/2000 | Snodgrass et al. | 396/611 |
| 6,103,636 | A | 8/2000 | Zahorik et al. | 438/745 |
| 6,132,586 | A * | 10/2000 | Adams et al. | 205/123 |
| 6,214,513 | B1 * | 4/2001 | Cai et al. | 430/129 |
| 6,230,722 | B1 * | 5/2001 | Mitsumori et al. | 134/122 R |
| 6,341,998 | B1 * | 1/2002 | Zhang | 451/41 |
| 6,391,166 | B1 * | 5/2002 | Wang | 204/224 R |
| 6,398,975 | B1 | 6/2002 | Mertens et al. | 216/92 |
| 6,417,117 | B1 * | 7/2002 | Davis | 438/782 |
| 6,446,358 | B1 * | 9/2002 | Mitsumori et al. | 34/611 |
| 6,488,040 | B1 * | 12/2002 | de Larios et al. | 134/95.2 |
| 6,491,764 | B2 | 12/2002 | Mertens et al. | 134/36 |
| 6,495,005 | B1 * | 12/2002 | Colgan et al. | 204/224 R |
| 6,530,823 | B1 * | 3/2003 | Ahmadi et al. | 451/39 |
| 6,531,206 | B2 * | 3/2003 | Johnston et al. | 428/172 |
| 6,543,080 | B1 * | 4/2003 | Tomita et al. | 15/102 |
| 6,550,988 | B2 * | 4/2003 | Sugimoto et al. | 396/564 |
| 6,555,017 | B1 * | 4/2003 | Rushford et al. | 216/84 |
| 6,616,772 | B2 * | 9/2003 | de Larios et al. | 134/21 |
| 6,629,540 | B2 * | 10/2003 | Mitsumori et al. | 134/122 R |
| 6,689,323 | B2 * | 2/2004 | Fisher et al. | 422/100 |
| 6,764,720 | B2 * | 7/2004 | Pui et al. | 427/479 |
| 6,988,327 | B2 * | 1/2006 | Garcia et al. | 34/407 |
| 7,093,375 | B2 * | 8/2006 | O'Donnell | 34/79 |
| 7,143,527 | B2 * | 12/2006 | Garcia et al. | 34/380 |
| 7,198,055 | B2 * | 4/2007 | Woods et al. | 134/95.2 |
| 7,350,316 | B2 * | 4/2008 | Woods et al. | 34/95.2 |
| 7,520,285 | B2 * | 4/2009 | Garcia | 134/98.1 |
| 2002/0020622 | A1 * | 2/2002 | Hanson et al. | 204/222 |
| 2002/0121290 | A1 | 9/2002 | Tang et al. | |
| 2002/0125212 | A1 | 9/2002 | Mertens et al. | 216/57 |
| 2003/0091745 | A1 * | 5/2003 | Yogev et al. | 427/350 |
| 2003/0094040 | A1 * | 5/2003 | Proett et al. | 73/152.05 |
| 2004/0136494 | A1 * | 7/2004 | Lof et al. | 378/34 |

FOREIGN PATENT DOCUMENTS

| | | |
|---|---|---|
| JP | 2280330 | 11/1990 |
| JP | 2309638 | 12/1990 |
| JP | 11350169 | 12/1990 |
| WO | WO 99/16109 | 4/1999 |
| WO | WO/02/01613 | 1/2002 |
| WO | WO/02/32825 | 4/2002 |
| WO | WO 02/101795 | 12/2002 |

* cited by examiner

WAFER EDGE SURFACE TREATMENT WITH LIQUID MENISCUS

CROSS REFERENCE TO RELATED APPLICATIONS

This application is a continuation-in-part and claims priority from U.S. patent application Ser. No. 09/608,244 filed on Jun. 30, 2000 now U.S. Pat. No. 6,488,040 and entitled "Capillary Proximity Heads for Single Wafer Cleaning and Drying" by John M. de Larios et al., U.S. patent application Ser. No. 10/261,839 filed on Sep. 30, 2002 now U.S. Pat. No. 7,234,477 and entitled "Method and Apparatus for Drying Semiconductor Wafer Surfaces Using a Plurality of Inlets and Outlets Held in Close Proximity to the Wafer Surfaces" by John M. de Larios et al., and U.S. patent application Ser. No. 10/603,427 filed on Jun. 24, 2003 now U.S. Pat. No. 7,000,622 and entitled "Methods and Systems for Processing a Bevel Edge of a Substrate Using a Dynamic Liquid Meniscus" by Carl A. Woods et al. The aforementioned applications are incorporated by reference in their entirety for all purposes.

BACKGROUND

Semiconductor chip fabrication is a complicated process that involves a coordinated series of precise operations. It is well known that during the various steps in these operations, the surfaces, edges, and bevels of the semiconductor substrate (i.e., semiconductor wafers) become contaminated with a layer of residue comprised of particulates, organic materials, metallic impurities (e.g., copper, aluminum, titanium, tungsten, etc.), and native oxides (e.g., silicon dioxide, etc.). The removal of these contaminants is a priority to semiconductor chip fabricators because the level of contamination on the wafer inversely correlates to the integrated circuit (IC) chip yield for each wafer and the overall reliability of those IC chips. Some examples of operations that may result in unwanted wafer contamination include plasma etching, chemical mechanical polishing (CMP), chemical vapor deposition (CVD), and metallization (e.g., copper electroplating, sputtering, etc.).

Increasingly, IC chip manufacturers are beginning to require removal of contaminants from the edge and bevel surfaces (i.e., bevel edge surfaces) of the semiconductor wafer. Their motivation is to increase each wafer's IC chip yield by reducing defects caused by bevel-edge borne contaminants that may flake off during the IC fabrication process and cross-contaminate wafers within a batch, or in other batches. Examples of conventional methods used to remove residue from the bevel edge surface of the wafer include chemical immersion of the entire wafer and direct application of chemicals to the surface of the wafer (i.e. clean the bevel edge while performing a standard immersion clean in a wet bench). Another method is to place the wafer face-down on a Bernoulli chuck and clean the backside with reaction chemistry, also cleaning the exposed bevel edge (i.e. SEZ approach).

The chemical immersion (CI) method involves dipping the entire wafer or wafer batch into a tank of chemicals and subsequently drying the wafer using techniques such as spin rinse drying (SRD) or Marangoni drying. There are several inherent limitations and disadvantages with the CI method. The method is not effective at cleaning polymer-based residues typically found on the bevel edge surface of the wafer. Polymer-based residues tend to be chemically resistant and require highly caustic chemical cleaners (e.g., HF, etc.) to effectuate their removal. As described above, CI methods expose the entire wafer to the chemical cleaner during the cleaning process. Since highly caustic chemical cleaners damage active regions of the wafer (typically not coated with the polymer-based residue), CI methods limit the types of chemical cleaners that can be used. Therefore, CI methods cannot be effectively utilized to clean polymer-based residues on the bevel edge surface of wafer. Further, CI methods sometimes cause contaminants to be transferred from the backside of the wafers to the front side of the wafer facing opposite. This is due to the removed contaminants, floating on the surface layer of the chemical solution in CI tank, attaching to the front and back sides of the wafer as it is being removed from the tank. As for conventional direct chemical application methods, they are disadvantaged because they do not allow for precise control over the area on the wafer surface that chemical is applied to thus limiting the types of chemical cleaners that can be used. This again poses difficulties when cleaning polymer-based residues on the bevel edge surfaces of the wafer.

In view of the forgoing, there is a need for a cleaning apparatus that avoids the problems of the prior art by allowing for precise application of chemicals to the edge surface of the semiconductor wafer.

SUMMARY

Broadly speaking, the present invention fills these needs by providing an improved apparatus for cleaning the edge surface of the semiconductor substrate. It should be appreciated that the present invention can be implemented in numerous ways, including as a system, an apparatus and a method. Several inventive embodiments of the present invention are described below.

In one embodiment, an apparatus used in the cleaning of an edge surface of a semiconductor substrate is disclosed. The apparatus includes a top portion and bottom portion. The top and bottom portions each have a proximity head element that is operatively attached to a manifold element. The manifold element is configured to uniformly disperse a fluid to the plurality of channels, which are defined within the proximity head element, during the cleaning of a semiconductor substrate edge surface. Both top and bottom portions of the apparatus are positioned so that they are proximate to the top edge surface and bottom edge surface of the semiconductor substrate, respectively.

In another embodiment, a system for cleaning an edge surface of a semiconductor substrate is disclosed. The system includes a proximity head unit that is positioned proximate to the edge surface of the semiconductor substrate, a substrate support that can impart a rotational velocity to the substrate, and a fluid supply that is operatively connected to the proximity head unit. The substrate support can be either a vacuum chuck or one or more rollers. Additionally, the proximity head unit can be divided into distinct top/bottom portions or incorporated into one integrated portion.

In still another embodiment, a method for cleaning an edge surface of a semiconductor substrate is disclosed. The proximity head unit is positioned so that the flow head portion and the collection head portion of the proximity head unit are proximate to the edge surface of the semiconductor substrate. The semiconductor substrate is then rotated. During the rotation of the semiconductor substrate, the flow head portion applies a fluid to the edge surface while the collection head portion collects fluid from the edge surface.

In yet another embodiment, a method for cleaning an edge surface of a semiconductor substrate using the sequential application of different fluids to the edge surface of a semiconductor substrate is disclosed. Initially, two or more proximity head units are positioned proximate to the edge surface but in different regions along the circumference of the semiconductor substrate. The semiconductor substrate is then rotated at a first set rotational velocity. Next, the first proximity head unit applies a first fluid to a first region of the edge surface of the semiconductor substrate. Contemporaneous with the application of the first fluid to the first region, the second proximity head unit applies a second fluid to a second region of the edge surface of the semiconductor substrate. The rotational velocity of the semiconductor substrate may be adjusted as needed to effectuate a desired dwell time for the fluids applied to the semiconductor substrate edge surfaces.

BRIEF DESCRIPTION OF THE DRAWINGS

The present invention will be readily understood by the following detailed description in conjunction with the accompanying drawings, and like reference numerals designate like structural elements.

DETAILED DESCRIPTION

An invention is described for apparatuses, systems, and methods for cleaning the bevel edge surface of a semiconductor substrate. It will be obvious, however, to one skilled in the art, that the present invention may be practiced without some or all of these specific details. In other instances, well known process operations have not been described in detail in order not to unnecessarily obscure the present invention.

A semiconductor substrate can be made of any silicon-based material. In one exemplary embodiment, the substrate is a semiconductor wafer, which is a thin slice of semiconductor material, such as a silicon crystal, upon which microcircuits are constructed by diffusion and deposition of various materials. In this document, the terms semiconductor substrate and semiconductor wafer are used inter-changeably. What is disclosed by the embodiments herein is essentially a semiconductor substrate edge cleaning system that utilizes customized configurations of proximity heads allowing for precise and sequential application of chemicals to the edge surfaces of a semiconductor substrate.

Figure 1A:
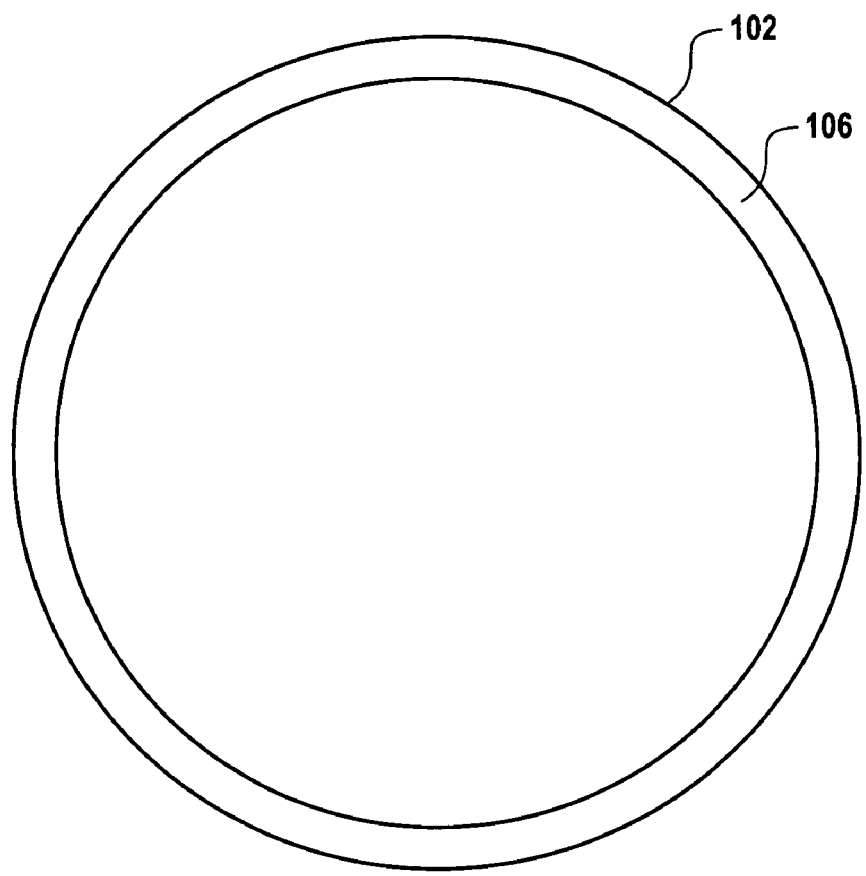
FIG. 1A shows a top view of a semiconductor substrate and an outline of the edge exclusion zone of the semiconductor substrate.

FIG. 1A shows a top view of a semiconductor substrate 102 and an outline of the edge exclusion zone 106 of the semiconductor substrate. Typically, the edge exclusion zone 106 includes the portion of the semiconductor substrate 102 that stretches radially to about 5.0 millimeters (mm) from the edge of the semiconductor substrate. In one exemplary embodiment, the edge exclusion zone extends radially to about 0.5 mm from the edge of the semiconductor substrate.

Figure 1B:
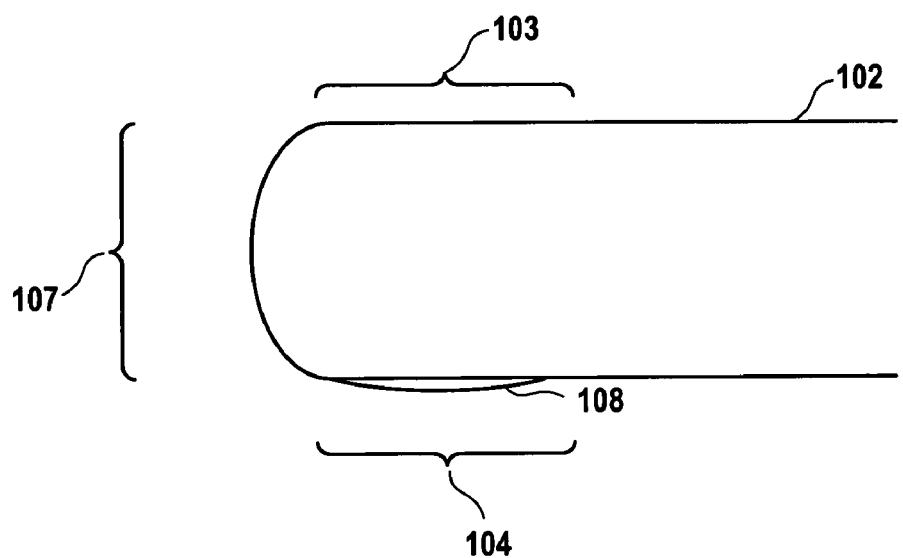
FIG. 1B shows an enlarged cross-sectional view of a semiconductor substrate with a layer of contaminant residue deposited on its top edge and bottom edge surfaces (i.e., edge surfaces), and bevel surface.

FIG. 1B shows an enlarged cross-sectional view of a semiconductor substrate 102 with a layer of contaminant residue 108 deposited on the bottom edge 104 surface. The top edge surface 103, bottom edge surface 104, and bevel surface 107 of the semiconductor substrate form the bevel edge surface of the semiconductor substrate. The edge exclusion zone 106 (See FIG. 1A) is a demarcated area within the bevel edge surface of the semiconductor substrate 102.

Figure 2A:
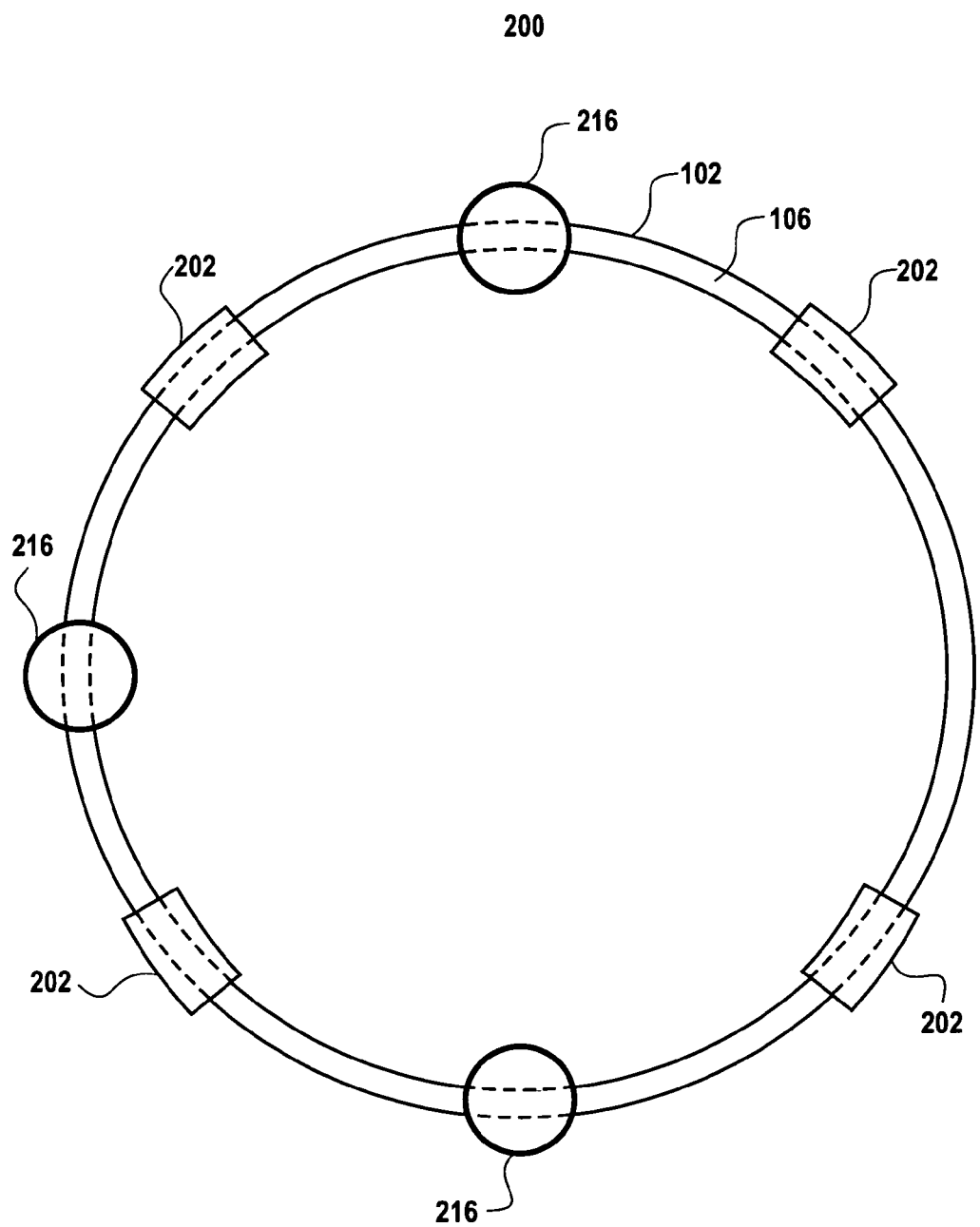
FIG. 2A depicts a high level schematic diagram of a semiconductor substrate edge cleaning system, in accordance with one embodiment of the present invention.

FIG. 2A depicts a high level schematic diagram of a semiconductor substrate edge cleaning system 200, in accordance with one embodiment of the present invention. In this particular embodiment, the system 200 includes a set of three rollers 216 to support the semiconductor substrate 102 and four proximity head units 202 that are positioned proximate to the edge exclusion zone 106 of the semiconductor substrate. Each proximity head unit 202 is comprised of top portion and bottom portions (further described in FIG. 2C) that are respectively positioned over the top edge surface and bottom edge surface of the semiconductor substrate 102. The top portion and bottom portions of the proximity head units 202 are aligned (i.e., substantially overlap each other) but are separated from each other to create a gap that enables the semiconductor substrate 102 to fit in between the top and bottom portions. In one exemplary embodiment, the rollers 216 are cylindrical drive wheels which have longitudinal surfaces that are optimally shaped to support and impart a rotational velocity to the semiconductor substrate 102. Of course, it should be appreciated that a vacuum chuck may also be used to support and rotate the semiconductor substrate 102 eliminating the need for the rollers 216 altogether.

Still referring to FIG. 2A, in this exemplary embodiment, the proximity head units 202 are configured so that they can precisely apply fluids to the edge surface of the semiconductor substrate. Additionally, the semiconductor substrate edge cleaning system 200 is shown with four proximity head units 202 equally distanced from one another along the circumference of the semiconductor substrate. One skilled in the art will appreciate that although the proximity head units 202 are depicted as being equally spaced from each other, this is but one embodiment. That is, the spacing between the proximity head units 202 may be adjusted according to the requirements of the user or the proximity head units can be placed adjacently to one another.

Continuing with FIG. 2A, as shown in this exemplary embodiment, each proximity head unit 202 is configured to apply a fluid to a different edge surface region along the circumference of the semiconductor substrate 102. Each proximity head unit 202 utilizes fluids stored in a fluid supply (not shown) that is operatively connected to each respective proximity head unit. It should be appreciated that the fluids provided by the fluid supply can be either a liquid (e.g., chemicals, solutions, etc.) or a gas. A number of different chemicals and solutions can be used for cleaning the edge exclusion zone 106 of a semiconductor substrate including: Ammonium Peroxide ($NH_4OH$), Hydrogen Peroxide ($H_2O_2$), Hydrofluoric Acid (HF), Deionized Water (DIW), and SC-1 solution ($NH_4OH/H_2O_2/H_2O$). Gases are primarily utilized to facilitate the drying of the semiconductor substrate 102 and are typically either Isopropyl Alcohol (IPA) vapor or Nitrogen ($N_2$) gas. However, one skilled in the art will appreciate that the range of fluids, liquids or gases, available for this application is vast and that the actual fluid utilized will depend largely on the particular application and the type of residue 108 being removed.

Remaining with FIG. 2A, the use of a four proximity head unit 202 arrangement allows for the in-situ sequential treatment of the semiconductor substrate edge surface with the same or different types of fluids depending on the application. It should be appreciated that this can be accomplished by either configuring each of the four proximity head units 202 to supply a different fluid or dividing the four proximity head units into groups of two or more that apply the same fluid. In one embodiment, the system 200 can be configured so that the rotational velocity of the semiconductor substrate 102 can be adjusted to change dwell time of fluids applied to the edge surface of the semiconductor substrate. One skilled in the art will appreciate that although the semiconductor substrate edge cleaning system 200 is shown with four proximity head units 202, this is but one embodiment. That is, sequential treatment of the semiconductor substrate edge surface can be realized with any number of proximity head units 202 as so as long as there are two or more proximity head units positioned over the surface of the semiconductor substrate 102.

Figure 2B:
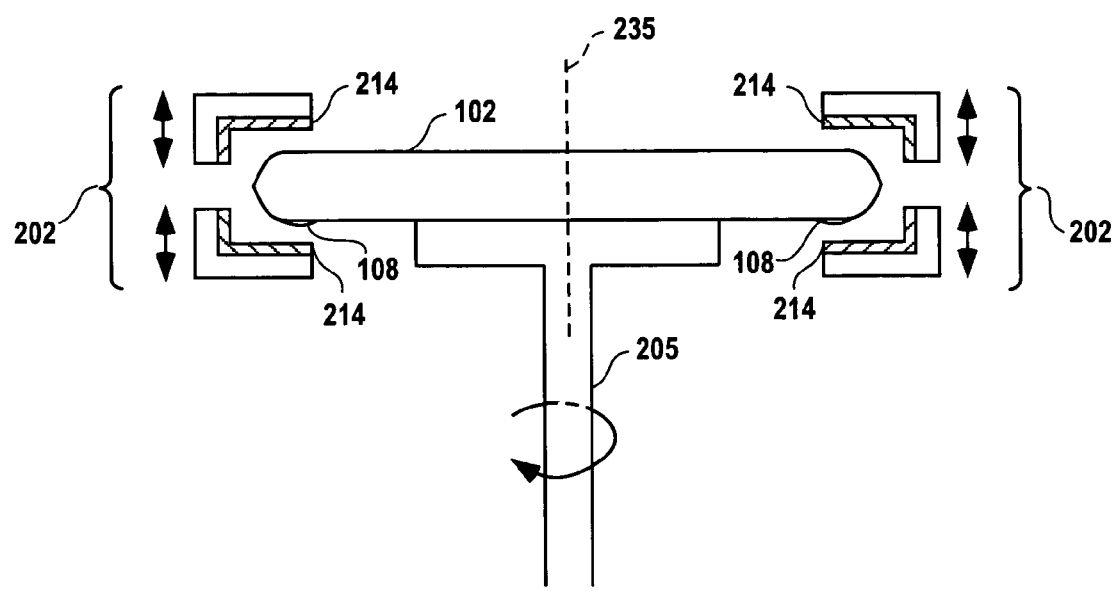
FIG. 2B shows a side view of a semiconductor substrate edge cleaning system, in accordance with one embodiment of the present invention.

FIG. 2B shows a side view of the semiconductor substrate 102 edge cleaning system, in accordance with one embodiment of the present invention. In this embodiment, a semiconductor substrate 102 is supported by a vacuum chuck 205 that is configured to impart a rotational velocity to the semiconductor substrate. The vacuum chuck 205 applies a vacuum to the bottom surface of the semiconductor substrate 102 to ensure that the semiconductor substrate remains affixed in position when the vacuum chuck rotates. Two proximity head units 202, each with a top and a bottom portion, are positioned so that the proximity head elements 214 of each portion are respectively proximate to the top and bottom edge surfaces of the semiconductor substrate 102. In one exemplary embodiment, the top portion and bottom portions of the proximity head units 202 are configured so that they can move parallel to the axis of rotation 235 for the semiconductor substrate 102 to facilitate the placement and removal of the semiconductor substrate 102 onto the vacuum chuck 205.

Figure 2C:
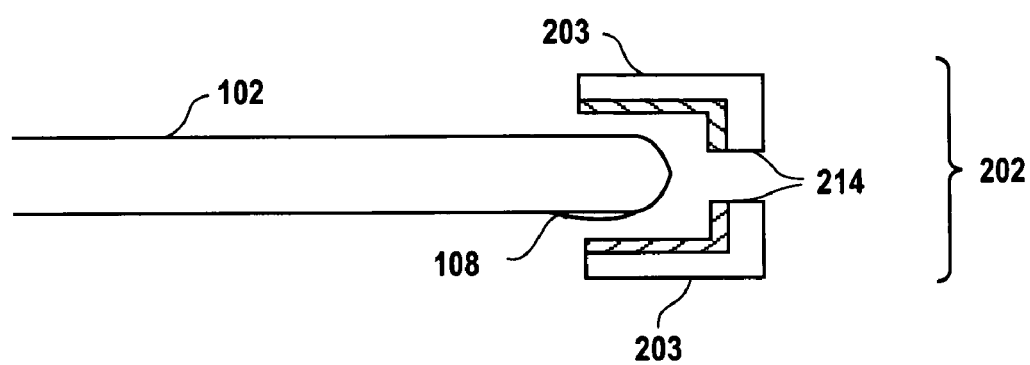
FIG. 2C shows an enlarged side-view depiction of the top and bottom portions of a proximity head unit placed proximate to the top edge and bottom edge surfaces of a semiconductor substrate, in accordance with one embodiment of the present invention.

FIG. 2C shows an enlarged side-view depiction of the top and bottom portions of a proximity head unit 202 placed proximate to the top edge and bottom edge surfaces of a semiconductor substrate 102, in accordance with one embodiment of the present invention. Each proximity head element 214 is coupled to a manifold element 203. The manifold element 203 aids in the distribution of fluids to the individual channels (not depicted) that are defined within each proximity head element. The channels extend from a top surface of each proximity head element 214 through to the bottom surface.

Still on FIG. 2C, in one embodiment, the top and bottom portions of the proximity head unit 202 are configured to apply and collect fluid to and from the semiconductor substrate. In another embodiment, the top portion (i.e., flow head portion) only supplies fluids while the bottom portion (i.e., collection head portion) only collects fluids or vice versa. The semiconductor substrate residue 108 deposited on the bottom edge surface of the semiconductor substrate is removed by a fluid meniscus formed through the proximity head element 214 of the proximity head unit 202.

Figure 2D:
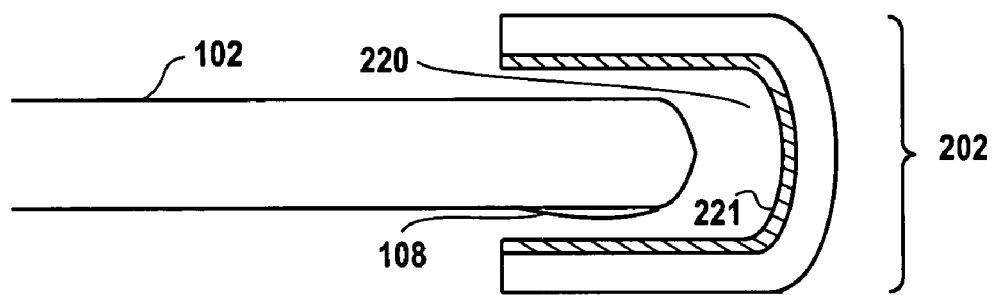
FIG. 2D shows one embodiment of the proximity head unit whereby the top and bottom portions are connected to form an integrated proximity head unit.

FIG. 2D shows one embodiment of the proximity head unit 202 (see FIG. 2A) whereby the top and bottom portions are connected via a connecting section to form an integrated proximity head unit 222. The integrated proximity head unit 222 is curved to form a channel 220 defined by a gap between the top edge of the semiconductor substrate 102, bottom edge of the semiconductor substrate, bevel surface of the semiconductor substrate and an inner surface 221 of the integrated proximity head. The integrated proximity head unit 222 functions by simultaneously supplying fluid to and collecting fluid from the top edge, bottom edge, and bevel surfaces of the semiconductor substrate 102. Again, as with the other embodiments discussed above, a fluid meniscus is formed on the semiconductor substrate surface to effectuate the actual removal of residue from the semiconductor substrate surface.

Figure 3:
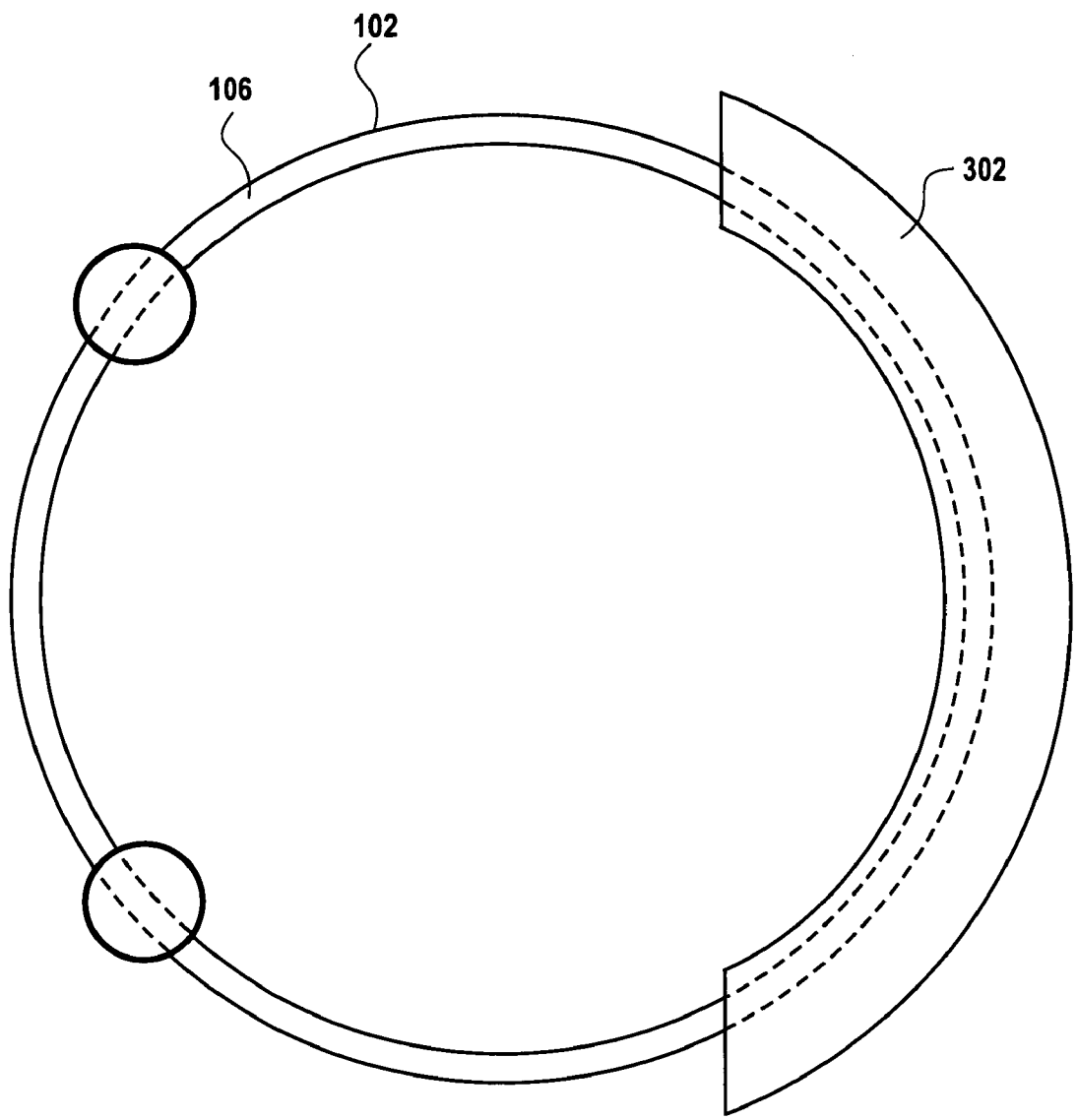
FIG. 3 depicts a top-view of a partial annular shaped proximity head unit, in accordance with one embodiment of the present invention.

FIG. 3 depicts a top-view of a partial annular shaped proximity head unit 302, in accordance with one embodiment of the present invention. The proximity head unit 302 is defined over a portion of the edge exclusion zone 106 which curves around the circumference of the semiconductor substrate 102. One who is skilled in the art will recognize that the width of the proximity head unit 302 can be customized to cover as much or as little of the circumference of the semiconductor substrate as is required by the particular application. That is, the shape of the proximity head unit 302 may be customized as needed to afford more or less coverage over the circumference of the semiconductor substrate. In one embodiment, the proximity head unit 302 has separate top and bottom portions that are positioned proximate to the top edge and bottom edge surface of the semiconductor substrate 102 as depicted in FIG. 2C. As with the various proximity head unit embodiments discussed above, it should be appreciated that the top and bottom portions can also be connected to form an integrated proximity head unit (see FIG. 2D).

Figure 4:
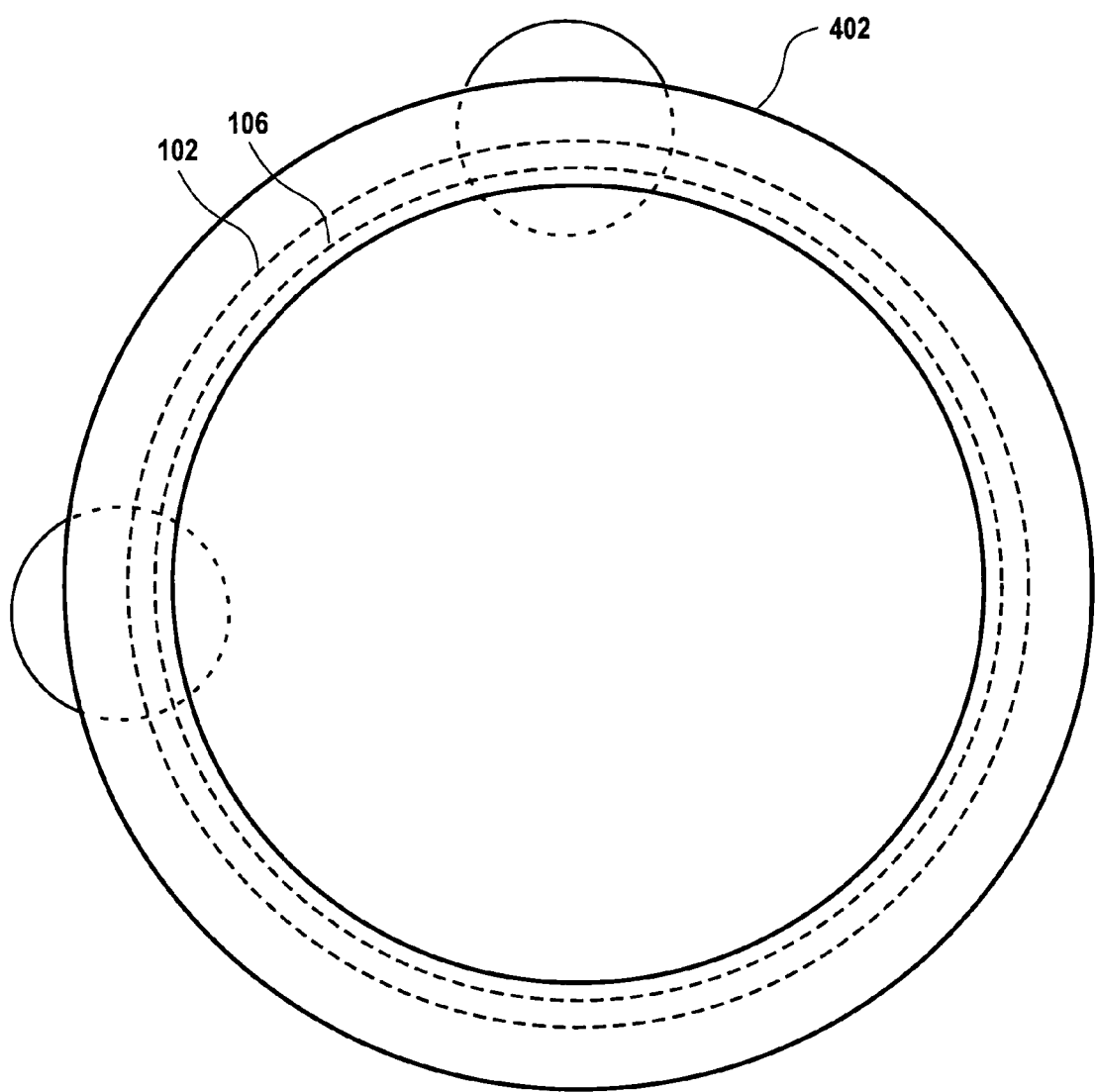
FIG. 4 shows a top-view of an annular shaped proximity head unit, in accordance with one embodiment of the present invention.

FIG. 4 shows a top-view of an annular shaped proximity head unit 402, in accordance with one embodiment of the present invention. In this embodiment, the proximity head unit 402 extends to completely cover the edge exclusion zone 106 around the circumference of the semiconductor substrate 102. One skilled in the art will know that the internal diameter of the annular proximity head unit 402 opening can be customized according to the specifications of the user. That is, the size of the annular proximity head unit 402 can be adjusted depending on the requirements of the application. In one embodiment, the proximity head unit 402 has separate but aligned top and bottom portions that are positioned proximate to the top edge and bottom edge surface of the semiconductor substrate 102. As discussed above, it should be appreciated that the top and bottom portions can also be connected to form an integrated proximity head unit (see FIG. 2D). It will be apparent to one skilled in the art that proximity head unit 402 may be segmented into multiple units. That is, proximity head unit 402 may be segmented into 4-quarter units, 2-half units, etc. Furthermore, these segmented units may be adjacent to each other or separated apart from each other.

Figure 5:
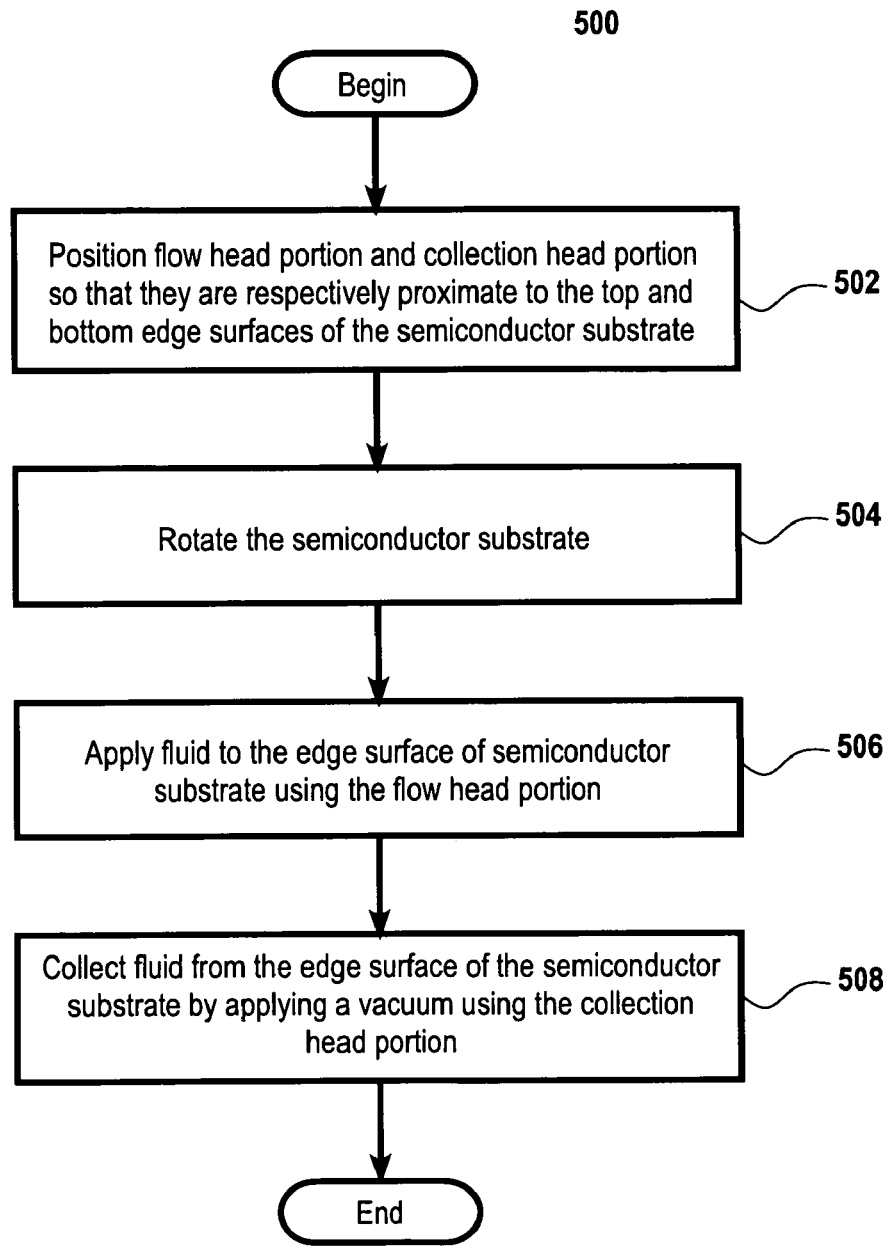
FIG. 5 shows a flow chart for a semiconductor substrate edge cleaning method 500, according to one embodiment of the present invention.

FIG. 5 shows a flow chart for a semiconductor substrate edge cleaning method 500, according to one embodiment of the present invention. Exemplary diagrams of the semiconductor substrate edge cleaning system utilized in this method are shown in FIGS. 2A and 2C. The method 500 starts with operation 502 where the flow head and collection head portions of the proximity head unit are respectively positioned proximate to the top edge surface and bottom edge surface of the semiconductor substrate as depicted in FIG. 2B. As discussed above, the amount of semiconductor substrate edge surface area covered by the proximity head unit is dependent on the radial length of the edge exclusion zone set by the user for the particular application. The method 500 then moves to operation 504 where the semiconductor substrate is rotated. In one embodiment, rollers are used to rotate the semiconductor substrate. In another embodiment, the semiconductor substrate is affixed by way of vacuum to a vacuum chuck support that provides the rotation. Next, the method 500 proceeds to operation 506 where a fluid is applied to the edge surface of the semiconductor substrate by the flow head portion of the proximity head unit. Finally, the method 500 moves to operation 508 where the collection head portion of the proximity head unit applies a vacuum to the semiconductor substrate edge surface using the collection head. The vacuum will cause the collection head portion to capture the liquid that is applied by the flow head portion to the semiconductor substrate edge surface.

Figure 6:
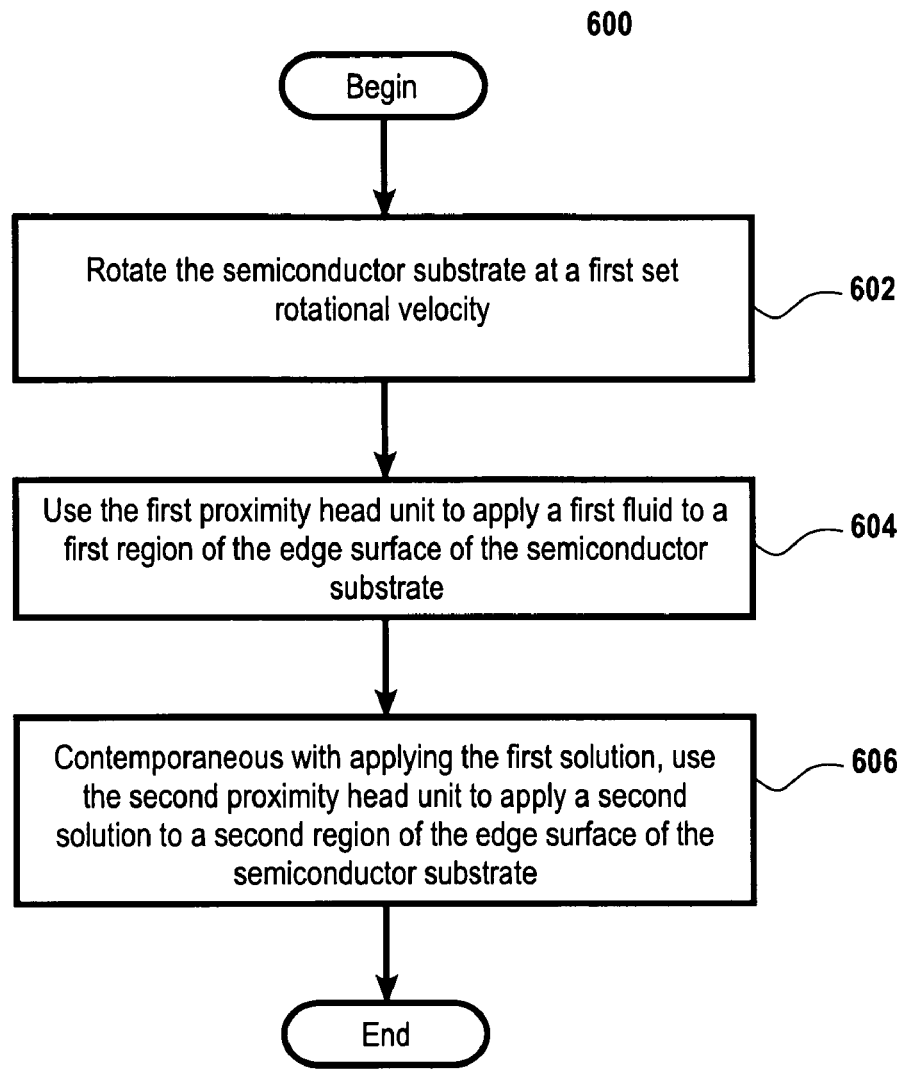
FIG. 6 shows a flow chart for a semiconductor substrate edge cleaning method 600, in accordance with one exemplary embodiment of the present invention.

FIG. 6 shows a flow chart for a semiconductor substrate edge cleaning method 600, in accordance with one exemplary embodiment of the present invention. Diagrams of the semiconductor substrate edge cleaning system utilized in this method are shown in FIGS. 2A and 2B. Method 600 starts with operation 602 where the semiconductor substrate is rotated at a set rotational velocity. It should be appreciated that the rotational velocity of the semiconductor substrate can be adjusted to effectuate any desired dwell time for the fluids applied to the edge surface of the semiconductor substrate. Next, the method 600 continues to operation 604 where the first proximity head unit applies a first fluid to a first region on the semiconductor substrate edge surface. It should be appreciated that although the first proximity head unit in this embodiment is shown to only apply a fluid to the semiconductor substrate edge surface, in other embodiments the first proximity head unit can also simultaneously collect fluid from the semiconductor substrate surface through the application of a vacuum. Finally, the method 600 moves to operation 606 where contemporaneous with the first proximity head unit applying a first fluid to a first region of the semiconductor substrate, a second proximity head unit applies a second fluid to a second region of the semiconductor substrate. Again, as with the first proximity head unit, the second proximity head unit may be configured to simultaneously collect fluid from the semiconductor substrate edge surface. Additionally, one skilled in the art will understand that although only two proximity head units were included in method 600, any number of proximity heads may be utilized in other embodiments.

Figure 7:
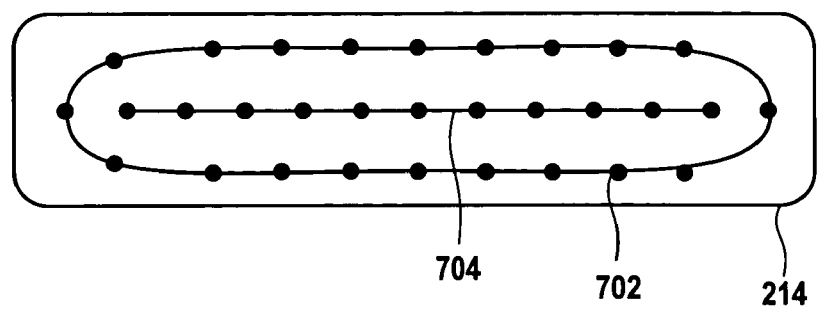
FIG. 7 depicts a bottom view of a proximity head element, in accordance with one embodiment of the present invention.
Figure 8:
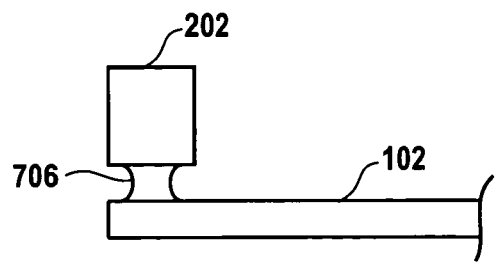
FIG. 8 shows a side view of a proximity head unit applying a fluid meniscus to the edge surface of a semiconductor substrate during an edge surface cleaning operation, in accordance with one embodiment of the present invention.

FIG. 7 depicts a bottom view of a proximity head element 214, in accordance with one embodiment of the present invention. Defined within the centerline of the proximity head element 214 are a plurality of fluid delivery channels 704 that supply fluid to the semiconductor substrate during the edge surface cleaning operation. Additionally, a plurality of fluid collection channels 702 are defined within the perimeter surface of the proximity head element 214; configured to collect fluid from the semiconductor substrate during the edge surface cleaning operation. It should be noted that the actual configuration of the ports may vary in number and geometric placement, so long as a meniscus can be formed as illustrated in FIG. 8. As used herein, channels 702 and 704 may be referred to as holes or ports.

FIG. 8 shows a side view of a proximity head unit 202 applying a fluid meniscus 706 to the edge surface of a semiconductor substrate 102 during an edge surface cleaning operation, in accordance with one embodiment of the present invention. As depicted therein, the contemporaneous operation of the of the fluid deliver channels 704 and fluid collection channels 702 results in the formation of a fluid meniscus 706 on the edge surface of the semiconductor substrate. The fluid meniscus 706 effectuates the removal of residue from the edge surface of the semiconductor substrate 102. Further details on the structure of the proximity head are provided in the references listed below.

For additional information about the proximity vapor clean and dry system, reference can be made to an exemplary system described in the U.S. Pat. No. 6,488,040, issued on Dec. 3, 2002 and entitled "CAPILLARY PROXIMITY HEADS FOR SINGLE WAFER CLEANING AND DRYING." This U.S. Patent Application, which is assigned to Lam Research Corporation, the assignee of the subject application, is incorporated herein by reference.

For additional information with respect to the proximity head, reference can be made to an exemplary proximity head, as described in the U.S. Pat. No. 6,616,772, issued on Sep. 9, 2003 and entitled "METHODS FOR WAFER PROXIMITY CLEANING AND DRYING." This U.S. Patent Application, which is assigned to Lam Research Corporation, the assignee of the subject application, is incorporated herein by reference.

For additional information about top and bottom menisci, reference can be made to the exemplary meniscus, as disclosed in U.S. patent application Ser. No. 10/330,843, filed on Dec. 24, 2002 and entitled "MENISCUS, VACUUM, IPA VAPOR, DRYING MANIFOLD." This U.S. Patent Application, which is assigned to Lam Research Corporation, the assignee of the subject application, is incorporated herein by reference.

For additional information about top and bottom menisci, vacuum, and IPA vapor, reference can be made to the exemplary system, as disclosed in U.S. patent application Ser. No. 10/330,897, filed on Dec. 24, 2002 and entitled "SYSTEM FOR SUBSTRATE PROCESSING WITH MENISCUS, VACUUM, IPA VAPOR, DRYING MANIFOLD." This U.S. Patent Application, which is assigned to Lam Research Corporation, the assignee of the subject application, is incorporated herein by reference.

For additional information about proximity processors, reference can be made to the exemplary processor, as disclosed in U.S. patent application Ser. No. 10/404,270, filed on Mar. 31, 2003 and entitled "VERTICAL PROXIMITY PROCESSOR." This U.S. Patent Application, which is assigned to Lam Research Corporation, the assignee of the subject application, is incorporated herein by reference.

For additional information about front and back menisci, reference can be made to the exemplary dynamic meniscus, as disclosed in U.S. patent application Ser. No. 10/404,692, filed on Mar. 31, 2003 and entitled "METHODS AND SYSTEMS FOR PROCESSING A SUBSTRATE USING A DYNAMIC LIQUID MENISCUS." This U.S. Patent Application, which is assigned to Lam Research Corporation, the assignee of the subject application, is incorporated herein by reference.

For additional information about meniscus, reference can be made to the exemplary dynamic liquid meniscus, as disclosed in U.S. patent application Ser. No. 10/603,427, filed on Jun. 24, 2003 and entitled "METHODS AND SYSTEMS FOR PROCESSING A BEVEL EDGE SUBSTRATE USING A DYNAMIC LIQUID MENISCUS." This U.S. Patent Application, which is assigned to Lam Research Corporation, the assignee of the subject application, is incorporated herein by reference.

For additional information about proximate cleaning and/or drying, reference can be made to the exemplary wafer process, as disclosed in U.S. patent application Ser. No. 10/606,022, filed on Jun. 24, 2003 and entitled "SYSTEM AND METHOD FOR INTEGRATING IN-SITU METROLOGY WITHIN A WAFER PROCESS." This U.S. Patent Application, which is assigned to Lam Research Corporation, the assignee of the subject application, is incorporated herein by reference.

For additional information about depositing and planarizing thin films of semiconductor substrates, reference can be made to the exemplary apparatus and method, as disclosed in U.S. patent application Ser. No. 10/607,611, filed on Jun. 27, 2003 and entitled "APPARATUS AND METHOD FOR DEPOSITING AND PLANARIZING THIN FILMS OF SEMICONDUCTOR WAFERS." This U.S. Patent Application, which is assigned to Lam Research Corporation, the assignee of the subject application, is incorporated herein by reference.

For additional information about cleaning a substrate using megasonic cleaning, reference can be made to the exemplary method and apparatus, as disclosed in U.S. patent application Ser. No. 10/611,140, filed on Jun. 30, 2003 and entitled "METHOD AND APPARATUS FOR CLEANING A SUBSTRATE USING MEGASONIC POWER." This U.S. Patent Application, which is assigned to Lam Research Corporation, the assignee of the subject application, is incorporated herein by reference.

For additional information about proximity brush cleaning, reference can be made to the exemplary proximity brush, as disclosed in U.S. patent application Ser. No. 10/742,303, filed on Dec. 18, 2003 and entitled "PROXIMITY BRUSH UNIT APPARATUS AND METHOD." This U.S. Patent Application, which is assigned to Lam Research Corporation, the assignee of the subject application, is incorporated herein by reference.

Various proximity heads and methods of using the proximity heads are described in co-owned U.S. patent application Ser. No. 10/834,548 filed on Apr. 28, 2004 and entitled "APPARATUS AND METHOD FOR PROVIDING A CONFINED LIQUID FOR IMMERSION LITHOGRAPHY," which is a continuation in part of U.S. patent application Ser. No. 10/606,022, filed on Jun. 24, 2003 and entitled "SYSTEM AND METHOD FOR INTEGRATING IN-SITU METROLOGY WITHIN A WAFER PROCESS." Additional embodiments and uses of the proximity head are also disclosed in U.S. patent application Ser. No. 10/404,692, filed on Mar. 31, 2003, entitled "METHODS AND SYSTEMS FOR PROCESSING A SUBSTRATE USING A DYNAMIC LIQUID MENISCUS." Additional information with respect to proximity cleaning can be found in U.S. patent application Ser. No. 10/817,355 filed on Apr. 1, 2004 entitled "SUBSTRATE PROXIMITY PROCESSING STRUCTURES AND METHODS FOR USING AND MAKING THE SAME," U.S. patent application Ser. No. 10/817,620 filed on Apr. 1, 2004 entitled "SUBSTRATE MENISCUS INTERFACE AND METHODS FOR OPERATION," and U.S. patent application Ser. No. 10/817,133 filed on Apr. 1, 2004 entitled "PROXIMITY MENISCUS MANIFOLD." The aforementioned patent applications are hereby incorporated by reference in their entirety.

Additional embodiments and uses of the proximity head are also disclosed in U.S. patent application Ser. No. 10/330,897, filed on Dec. 24, 2002, entitled "SYSTEM FOR SUBSTRATE PROCESSING WITH MENISCUS, VACUUM, IPA VAPOR, DRYING MANIFOLD" and U.S. patent application Ser. No. 10/404,270, filed on Mar. 31, 2003, entitled "VERTICAL PROXIMITY PROCESSOR," U.S. patent application Ser. No. 10/817,398 filed on Apr. 1, 2004 entitled "CONTROLS OF AMBIENT ENVIRONMENT DURING WAFER DRYING USING PROXIMITY HEAD," U.S. Pat. No. 6,488,040, issued on Dec. 3, 2002, entitled "CAPILLARY PROXIMITY HEADS FOR SINGLE WAFER CLEANING AND DRYING," and U.S. Pat. No. 6,616,772, issued on Sep. 9, 2003, entitled "Methods For Wafer Proximity Cleaning And Drying." Still further, additional embodiments and uses of the proximity head are described in U.S. patent application Ser. No. 10/883,301 entitled "CONCENTRIC PROXIMITY PROCESSING HEAD," and U.S. patent application Ser. No. 10/882,835 entitled "METHOD AND APPARATUS FOR PROCESSING WAFER SURFACES USING THIN, HIGH VELOCITY FLUID LAYER." Further embodiments and uses of the proximity head are further described in U.S. patent application Ser. No. 10/957,260 entitled "APPARATUS AND METHOD FOR PROCESSING A SUBSTRATE," U.S. patent application Ser. No. 10/956,799 entitled "APPARATUS AND METHOD FOR UTILIZING A MENISCUS IN SUBSTRATE PROCESSING" and U.S. patent application Ser. No. 10/957,384 entitled "PHOBIC BARRIER MENISCUS SEPARATION AND CONTAINMENT." The aforementioned patent applications are hereby incorporated by reference in their entirety.

Although a few embodiments of the present invention have been described in detail herein, it should be understood, by those of ordinary skill, that the present invention may be embodied in many other specific forms without departing from the spirit or scope of the invention. Therefore, the present examples and embodiments are to be considered as illustrative and not restrictive, and the invention is not to be limited to the details provided therein, but may be modified and practiced within the scope of the appended claims. Additionally, the operational steps disclosed in the method claims herein do not follow any pre-determined order and may be practiced in any order appropriate to the specific application.

What is claimed is:

1. An apparatus used in the cleaning of an edge surface of a semiconductor substrate, the apparatus comprising:
   a first portion configured to be disposed over a top edge surface of the semiconductor substrate, the first portion having a plurality of channels defined within the first portion, the plurality of channels extending from a top surface to a bottom surface of the first portion; and
   a second portion configured to be disposed under a bottom edge surface of the semiconductor substrate, the second portion having a plurality of channels defined within the second portion, the plurality of channels extending from a top surface to a bottom surface of the second portion, the second portion substantially aligned with the first portion wherein a gap is defined between the top surface of the second portion and the bottom surface of the first portion, the gap enabling the semiconductor substrate to fit therein.

2. The apparatus used in the cleaning of an edge surface of a semiconductor substrate as recited in claim 1, wherein the top edge surface and the bottom edge surface extends radially over the semiconductor substrate about 5.0 millimeters (mm) from a bevel surface of the semiconductor substrate.

3. The apparatus used in the cleaning of an edge surface of a semiconductor substrate as recited in claim 1, wherein the first portion and the second portion define an annular ring having a top edge extending over a top edge surface of the semiconductor substrate and a bottom edge extending over a bottom edge surface of the semiconductor substrate.

4. The apparatus used in the cleaning of an edge surface of a semiconductor substrate as recited in claim 1, wherein the first portion and the second portion define a portion of an annular ring having a top edge extending over a top edge surface of the semiconductor substrate and a bottom edge extending over a bottom edge surface of the semiconductor substrate.

5. The apparatus used in the cleaning of an edge surface of a semiconductor substrate as recited in claim 1, wherein a manifold is attached to the first portion, the manifold distributing fluids to the plurality of channels defined in the first portion.

6. The apparatus used in the cleaning of an edge surface of a semiconductor substrate as recited in claim 1, wherein a manifold is attached to the second portion, the manifold distributing fluids to the plurality of channels defined in the second portion.

7. The apparatus used in the cleaning of an edge surface of a semiconductor substrate as recited in claim 1, wherein the first portion and second portion are connected to form an integrated portion, the integrated portion having a top edge extending over a top edge surface of the semiconductor substrate, a connecting section extending over a bevel surface of the semiconductor substrate, and a bottom edge extending over a bottom edge surface of the semiconductor substrate.

8. The apparatus used in the cleaning of an edge surface of a semiconductor substrate as recited in claim 1, wherein the first portion and the second portion are configured to move substantially parallel to an axis of rotation of the semiconductor substrate.

* * * * *